(12) United States Patent
Hays et al.

(10) Patent No.: US 7,915,696 B2
(45) Date of Patent: Mar. 29, 2011

(54) ELECTRICAL CONNECTION THROUGH A SUBSTRATE TO A MICROELECTROMECHANICAL DEVICE

(75) Inventors: David Cecil Hays, Niskayuna, NY (US); Marco Francesco Aimi, Niskayuna, NY (US); Christopher Fred Keimel, Schenectady, NY (US); Glenn Scott Claydon, Wynantskill, NY (US); Kanakasabapathi Subramanian, Clifton Park, NY (US); Oliver Charles Boomhower, Waterford, NY (US)

(73) Assignee: General Electric Company, Niskayuna, NY (US)

( * ) Notice: Subject to any disclaimer, the term of this patent is extended or adjusted under 35 U.S.C. 154(b) by 620 days.

(21) Appl. No.: 11/877,786

(22) Filed: Oct. 24, 2007

(65) Prior Publication Data

US 2009/0107812 A1 Apr. 30, 2009

(51) Int. Cl.
*H01L 29/82* (2006.01)
(52) U.S. Cl. .................................. 257/415; 257/420
(58) Field of Classification Search .......... 257/415–420, 257/E29.105
See application file for complete search history.

(56) References Cited

U.S. PATENT DOCUMENTS

| | | | |
|---|---|---|---|
| 4,783,695 A | 11/1988 | Eichelberger et al. | |
| 5,374,792 A | 12/1994 | Ghezzo et al. | |
| 6,297,557 B1 | 10/2001 | Bothra | |
| 6,441,481 B1 | 8/2002 | Karpman | |
| 6,717,268 B2 | 4/2004 | Hau-Riege | |
| 6,767,764 B2 | 7/2004 | Saia et al. | |
| 6,773,962 B2 | 8/2004 | Saia et al. | |
| 6,788,981 B2 | 9/2004 | Garverick et al. | |
| 6,791,742 B2 | 9/2004 | Staker et al. | |
| 6,809,412 B1 * | 10/2004 | Tourino et al. | 257/678 |
| 6,809,753 B2 | 10/2004 | Tu | |
| 6,864,111 B2 | 3/2005 | Yu et al. | |
| 6,920,203 B2 | 7/2005 | Short et al. | |
| 6,943,495 B2 | 9/2005 | Ma et al. | |
| 6,946,728 B2 | 9/2005 | Chen et al. | |
| 6,987,304 B2 | 1/2006 | DCamp et al. | |
| 7,030,536 B2 | 4/2006 | Smith et al. | |
| 7,075,160 B2 | 7/2006 | Partridge et al. | |
| 2003/0190801 A1 | 10/2003 | Griffin, Jr. et al. | |
| 2005/0156259 A1 | 7/2005 | Yuasa | |
| 2006/0038301 A1 * | 2/2006 | Suzuki | 257/775 |

* cited by examiner

*Primary Examiner* — Cuong Q Nguyen
(74) *Attorney, Agent, or Firm* — Richard D. Emery

(57) ABSTRACT

An electrical through-connection, or via, that passes through a substrate to a bus on a first surface of the substrate. The via may be configured with an interlock such that the electrically conductive core of the via is constrained to thermally expand towards the second surface, away from the bus, thus preventing damage to the bus. The interlock may be a local constriction or enlargement of the via near the first surface of the substrate. The via may be greater in length along the bus than a unit spacing of beams in a parallel microswitch array actuated in unison along the bus. The via may be narrower in width than in length, and may form a trapezoidal geometry that is larger at the second surface of the substrate than at the first surface.

19 Claims, 5 Drawing Sheets

ELECTRICAL CONNECTION THROUGH A SUBSTRATE TO A MICROELECTROMECHANICAL DEVICE

BACKGROUND

The present invention relates to electrical connections through one or more packaging layers of a microelectromechanical system (MEMS) device, and particularly to vias through a substrate of an array of such devices.

Microelectromechanical systems (MEMS) are electromechanical devices that generally range in size from a micrometer to a millimeter in a miniature sealed package. A MEMS device in the form of a microswitch has a movable electrode called a beam that is moved toward a stationary electrical contact by the influence of a gate electrode positioned near the beam. The movable electrode may be a flexible beam that bends under applied forces such as electrostatic attraction, magnetic attraction and repulsion, thermally induced mismatch, that closes a gap between a free end of the beam and the stationary contact. MEMS devices need optimal heat dissipation and minimal electrical resistance to avoid destructive heat accumulation. This applies to the device itself and to all electrical connections to the device. Electrical through-connections called vias pass electrical power through the package to the MEMS electrodes. Vias generally have good electrical conductivity and heat transfer.

However, some applications require multiple MEMS devices. For example, in a switching application a higher switching current than the capacity of a single microswitch may be desired. In particular, multiple microswitches can be connected in a parallel circuit on the same substrate and actuated in unison to provide higher current capacity as needed. This circuitry has been used for example in motor starter and protection circuits. Typical through wafer via etch technology, such as selective etching by potassium hydroxide (KOH), has a geometrical drawback when used with closely spacing vias. While deep reactive ion etch of vias enables micron scale packing of vias, the vertically oriented geometry limits placing the vias near or under MEMS structures due to thin film stress induced by thermal expansion of the via material. For high power MEMS switch applications, vias should be in close proximity to the switching elements to maximize thermal dissipation, minimize resistance and minimize inductance between the MEMS elements and control circuitry.

Accordingly, there is a need for an improved via and bus geometry for an array of MEMS devices.

BRIEF DESCRIPTION

Generally, the present invention fulfills the foregoing needs by providing in an aspect thereof, a microelectromechanical system (MEMS) circuitry including an electrical connection through a substrate. The circuitry includes a substrate comprising first and second mutually opposite surfaces separated by a distance. An electrical bus may be disposed on the first surface of the substrate. A via is arranged to pass through the substrate from the bus to the second surface of the substrate. The via is at least partly filled with an electrically conductive material. The via may be configured to define an interlock positioned to reduce thermally-induced expansion of the electrically conductive material with respect to at least one of the surfaces.

The present invention further fulfills the foregoing needs by providing in an aspect thereof, an microelectromechanical system (MEMS) switching circuitry including an electrical connection through a substrate. The switching circuitry includes a substrate comprising a thickness and first and second mutually opposite surfaces. An electrical bus may be mounted on the first surface of the substrate. A via may be arranged to pass through the substrate from the bus to the second surface of the substrate. The via may include a trench through the substrate at least partly filled with an electrical conductor. The bus may anchor, contact, or actuate a plurality of microswitch beams in unison along a length of the bus. The via includes a longitudinal dimension substantially aligned with the length of the bus.

In yet another aspect thereof, the present invention provides microelectromechanical system (MEMS) circuitry including an electrical connection through a substrate. The MEMS circuitry includes a substrate comprising a thickness and first and second mutually opposite surfaces. An electrical bus may be mounted on the first surface of the substrate. The bus has a length and a width. A via may be arranged to pass through the substrate from the bus to the second surface of the substrate. The via may include a trench through the substrate at least partly filled with an electrical conductor. The via may have a generally prismatic trapezoidal geometry comprising first and second opposed faces substantially normal to the first surface of the substrate, and comprising third and fourth faces substantially normal to the first and second faces of the via and oblique to the first surface of the substrate. The via may be greater in length at the second surface of the substrate than at the first surface of the substrate and may be greater in length along the length of the bus than in width along the width of the bus.

In still another aspect thereof, the present invention provides microelectromechanical system (MEMS) switching circuitry including an electrical connection through a substrate. The switching circuitry includes an electrical bus mounted on a first surface of the substrate. A via may pass through the substrate from the bus to a second surface of the substrate. The via may include a trench through the substrate at least partly filled with an electrical conductor. The trench and the conductor may be formed with a geometry that blocks the conductor from expanding toward the bus. The bus may anchor, actuate, or contact a plurality of microswitch beams along a length of the bus. The via may include a longitudinal dimension substantially aligned with the length of the bus. The longitudinal dimension of the via may be greater than a unit spacing of the beams along the length of the bus.

In yet still another aspect thereof, the present invention provides an electrical connection through a substrate. The connection includes a substrate comprising a first and a second opposed surfaces. A via may pass through the substrate from the first surface to the second surface, and may be configured with an interlock such that an electrical conductor disposed within the via is constrained to extrude towards at least one of the surfaces.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The inventors of the present invention have recognized innovative concepts that result in an improved via and bus geometry for an array of MEMS-based circuitry devices. For example, such an improved geometry reduces their size, resistance, inductance, and may further allow fabrication by KOH etching. The description below focuses in one example embodiment where the array of MEMS-based circuitry devices comprises a microswitch array. It will be understood, however, that the inventive aspects of the present invention are not limited to a microswitch array since any MEMS-based circuitry device can benefit from such improved via and bus geometry.

Figure 1:
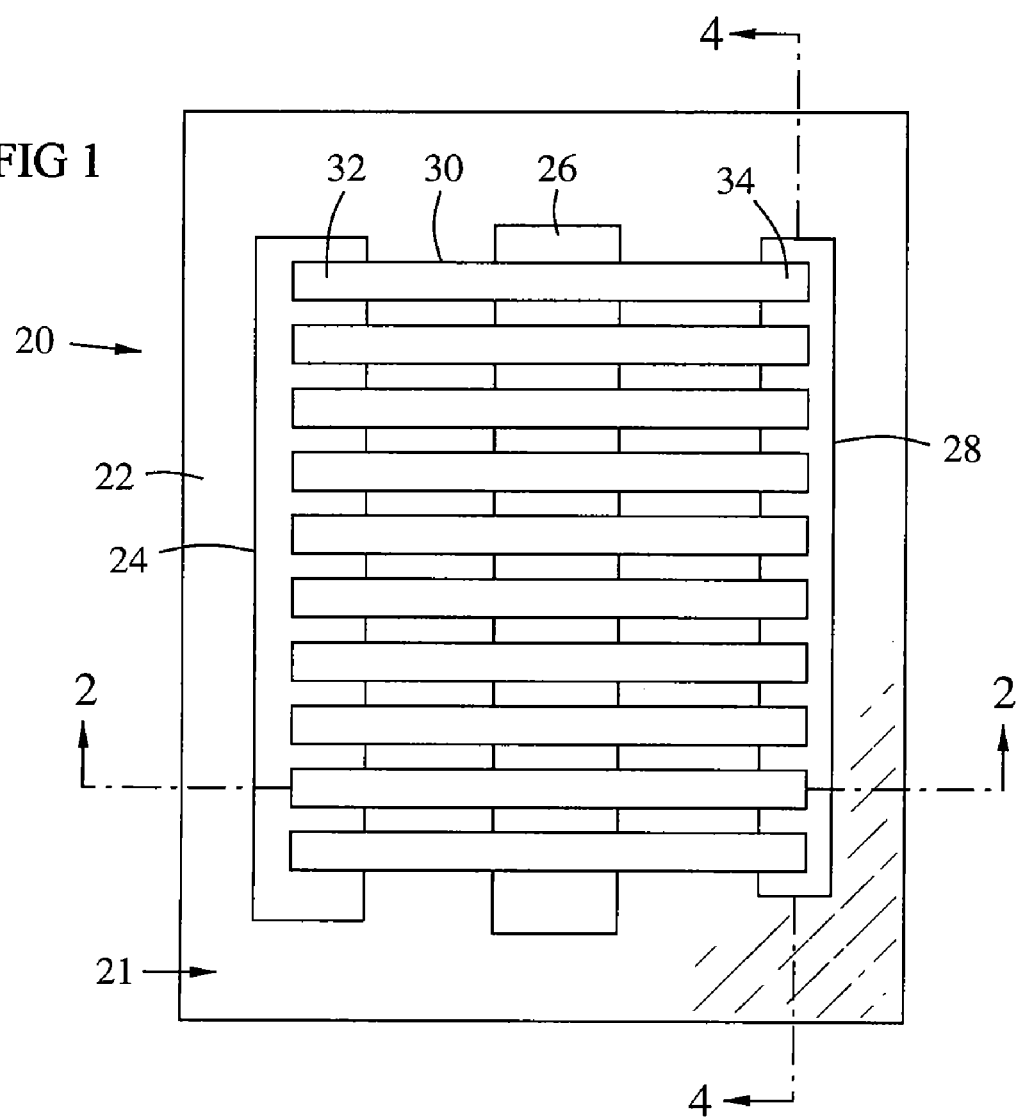
FIG. 1 is a top view of a parallel microswitch array on a substrate.

FIG. 1 shows a top view of one example embodiment of an array of MEMS devices. This example embodiment comprises a microswitch array 20 (e.g., a parallel circuit array) on a first surface 21 of a substrate 22. An anchor bus 24 anchors a fixed end 32 of multiple microswitch beams 30. A contact bus 28 is separated from a free end 34 of the beams by a contact gap 38 shown in FIG. 2. A gate bus 26 is separated from an intermediate portion of the beams by a gate gap 36. When a first voltage is applied to the anchor bus, and a second substantially different voltage is applied to the gate bus, the beams are electrostatically attracted toward the gate bus, and contact the contact bus. The switches then close, and current flows through the beams between the anchor bus and the contact bus. There is no significant electrical conduction between the beam and the gate. The gate gap 36 may be larger than the contact gap 38 to avoid contact between the beam and the gate.

This MEMS device is shown to illustrate an example application of the invention. However, aspects of the present invention are not limited to particulars of this parallel microswitch array. For example, the illustrated gate bus 26 actuates the beams 30 by electrostatic attraction, but aspects of the invention may also apply to MEMS devices actuated by other means, such as electromagnetic or piezoelectric operation or through mismatch in the coefficient of thermal expansion (CTE) or simply thermal expansion.

Figure 2:
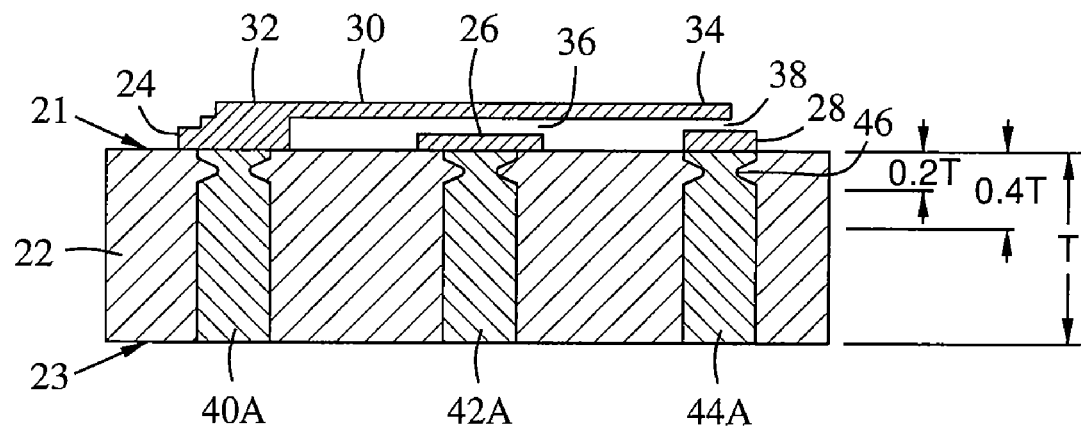
FIG. 2 is a sectional view taken along line 2-2 of FIG. 1 showing vias with constrictive interlocks.
Figure 3:
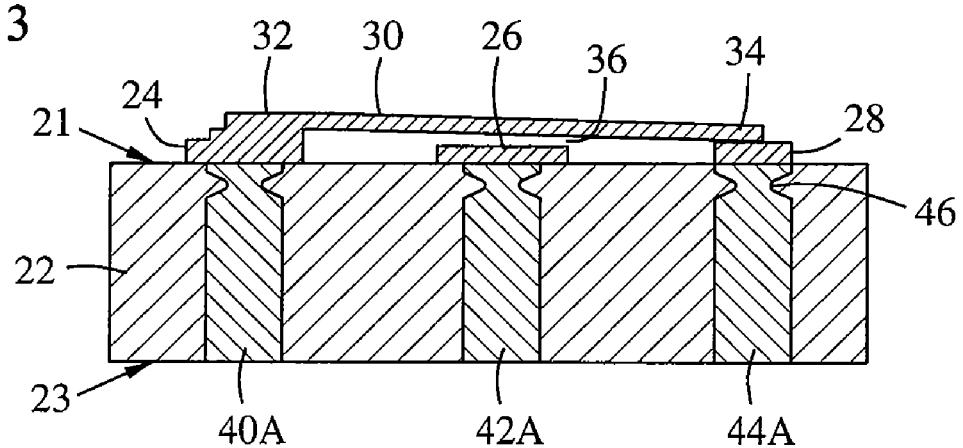
FIG. 3 is a sectional view as in FIG. 2 with the switch closed.

FIG. 2 shows an anchor bus via 40A, a gate bus via 42A, and a contact bus via 44A passing through the substrate 22 to a second surface 23 of the substrate. These vias provide electrical connections to respective contacts on a circuit board. FIG. 3 shows a microswitch beam 30 in the closed switch position. Interlocks 46 may engage the via with the substrate near the first surface 21 of the substrate. In one example embodiment, these interlocks may be formed within a certain distance of surface 21, such as within 40% of the distance T from the first surface 21 to the second surface 23 of the substrate, or in another example embodiment within a distance relatively closer to surface 21, such as within 20% of the distance T. This prevents the via from thermally expanding toward the respective bus. Via cores are often metal with a higher coefficient of thermal expansion (CTE) than that of the substrate, which may be silicon or another non-metal as known in the art. Thus, as temperatures rise during use, the via expands relative to the substrate. If it expands toward the bus, it can induce stress in the surface films, deform the bus, change a critical gap dimension, and degrade or destroy the microswitch. An interlock 46, allows only a percentage of the via to expand toward the bus. For example, with an interlock positioned as in FIG. 2, just 20% of the via can expand toward the bus, reducing expansion toward the bus by up to 80%. It will be understood that the actual positioning of the interlock may be tailored to the needs of any given application. Accordingly, the foregoing numerical percentages should be just viewed in an example sense and not in a limiting sense.

Figure 4:
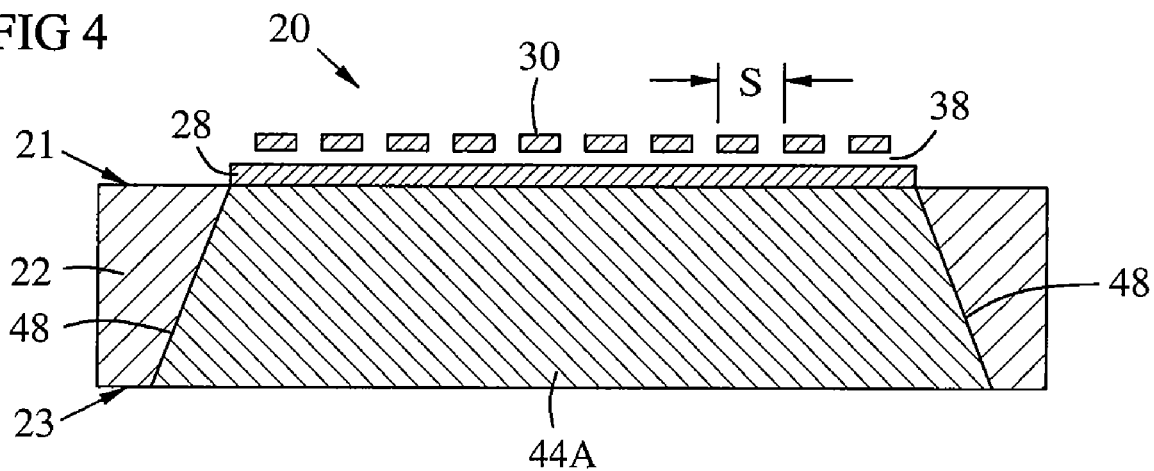
FIG. 4 is a sectional view taken along line 4-4 of FIG. 1.

FIG. 4 shows a via 44A spanning the length of the contact bus 28. This single via serves multiple beams 30 along the contact bus. Thus, the unit spacing S of the beams can be less than if each beam had a separate via, as in prior art. Here "unit spacing" means the distance between corresponding points on two adjacent beams. With this common via, the beams only require a minimal operational clearance between them. Furthermore, this single large via 44A can carry more current with lower resistance, thus producing less heat than smaller individual vias, because it has more volume for a given volume of the substrate. This configuration also allows the via 44A to be large enough for KOH etching, for example. It will be understood that one is not limited to any specific etching type. For example, ethylene diamine-pyrocatechol water (EDP) and tetramethyl ammonium hydroxide (TMAH) and other types may also be used. The via 44A may be longer at the second surface 23 of the substrate than at the first surface 21, as shown, forming a trapezoidal volume with two opposed faces 48 that are oblique to the surfaces 21, 23 of the substrate. The via 44A may be narrower in thickness transverse to the bus 28 as in FIG. 2 than along the length of the bus as in FIG. 4. For example, the via may be limited in width to no greater than the width of the bus, as in FIG. 2. This geometry maximizes volume of the via without increasing the lateral clearance required between the busses, and may even reduce lateral clearance by comparison to separate vias for each beam. The hole formed in the substrate for such a via may be called a "trench", since it is relatively long and narrow. If desired, multiple vias could be provided for a given bus, each via spanning a subset of the beams on that bus.

Figure 5:
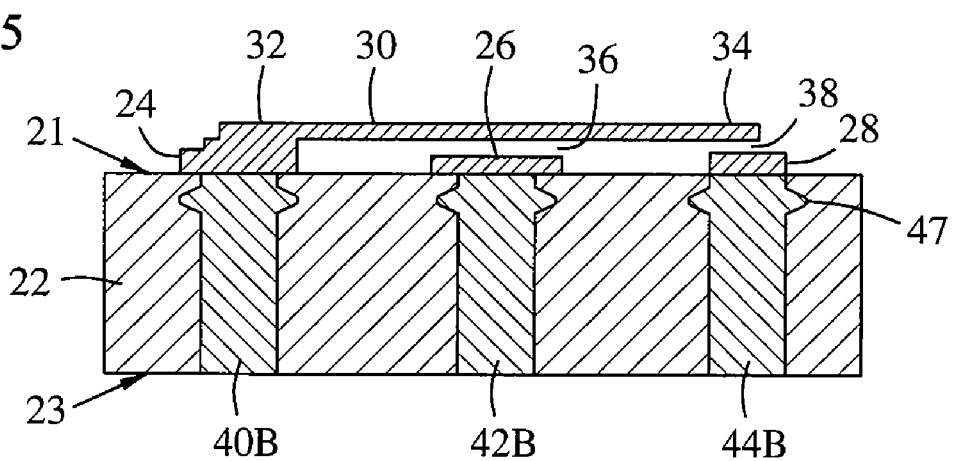
FIG. 5 is a sectional view as in FIG. 2 showing vias with enlargement interlocks.

The interlock 46 shown in FIG. 2 is a local constriction of the via. FIG. 5 shows vias 40B, 42B, 44B with an alternate form 47 of the interlock, which is a local enlargement. By "local" is meant that the via has either a smaller (for constriction type) or larger (for enlargement type) transverse dimension at the interlock than on both sides of the interlock. "Sides of the interlock" means adjacent the interlock toward the first and second surfaces of the substrate, or immediately above and below the interlock in the drawings.

Figure 6:
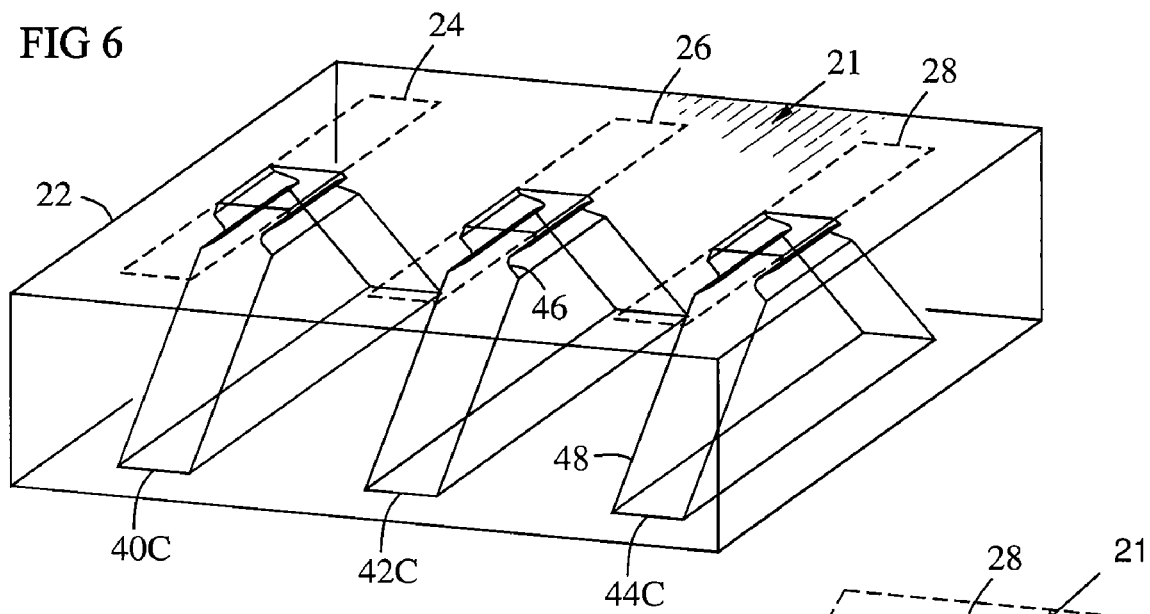
FIG. 6 is a transparent perspective view of a substrate with three trapezoidal vias with constrictive interlocks. The positions of three respective busses are shown in dashed lines on the top surface of the substrate.
Figure 7:
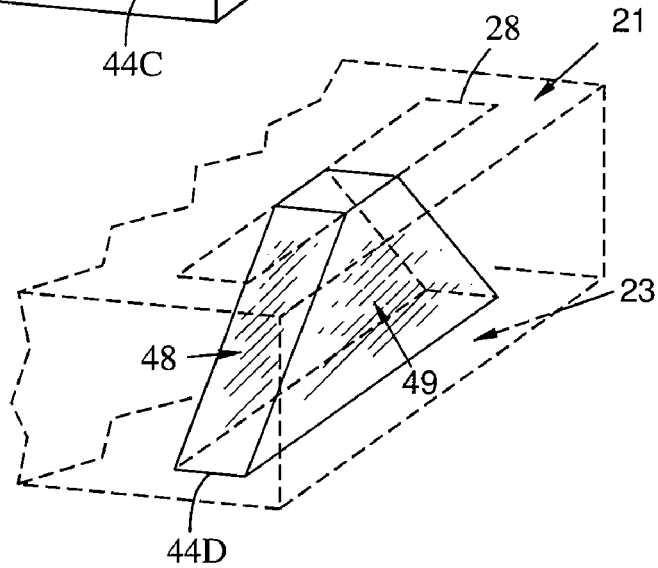
FIG. 7 is a perspective view of a trapezoidal via without interlocks.
Figure 8:
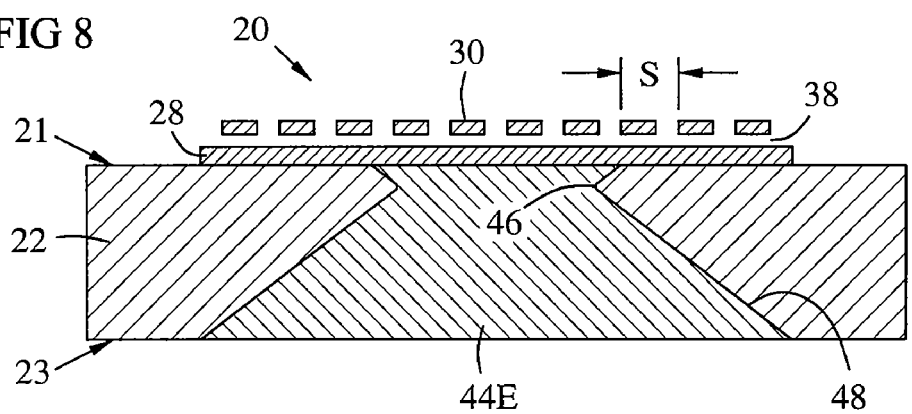
FIG. 8 is a sectional view of a trapezoidal via with constrictive interlocks on the oblique surfaces.
Figure 9:
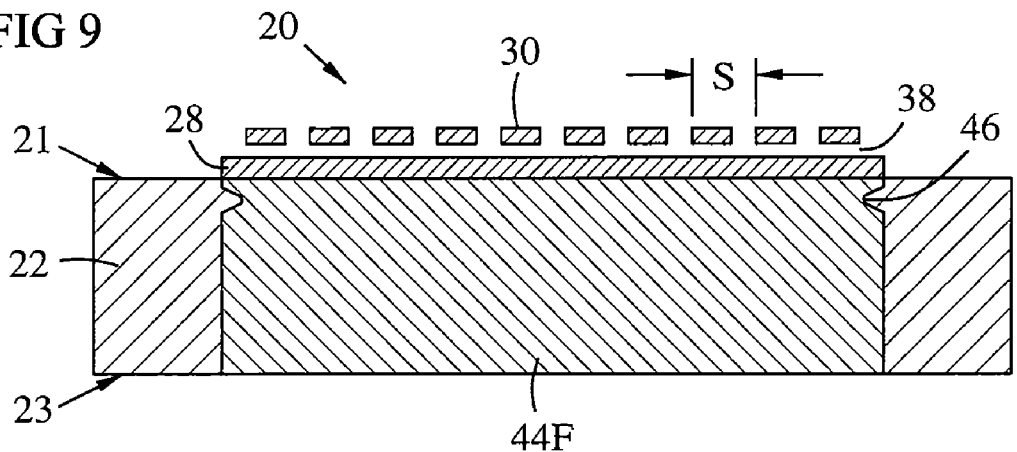
FIG. 9 is a sectional view of a via with surfaces normal to the substrate surfaces, and with constrictive interlocks.

FIG. 6 shows a transparent view of three vias 40C, 42C, and 44C in a substrate 22. Positions of respective busses 24, 26, and 28 are shown in dashed lines on the first surface 21 of the substrate. These vias have a trapezoidal geometry with constrictive interlocks 46. FIG. 7 shows a trapezoidal via 44D without interlocks. This example has two opposed faces 48 that are oblique to the surfaces 21, 23 of the substrate, and two opposed faces 49 that are normal to the oblique faces 48 and normal to the surfaces 21, 23 of the substrate. A trapezoidal via does not necessarily need an interlock, because it cannot expand toward the bus, at least not near the oblique surfaces 48. However, an interlock on a trapezoidal via may be beneficial, because it prevents the via from sliding along the oblique surfaces and pulling away from the bus, prevents the via from expanding toward the bus between the oblique surfaces, and prevents the via core from being pushed out of the substrate during fabrication, as later described. FIG. 8 shows a trapezoidal via 44E with a constriction interlock 46 formed on the oblique surfaces 48. FIG. 9 shows a via 44F with all sides normal to the substrate surfaces 21, 32, and with a constrictive interlock 46.

Figure 10:
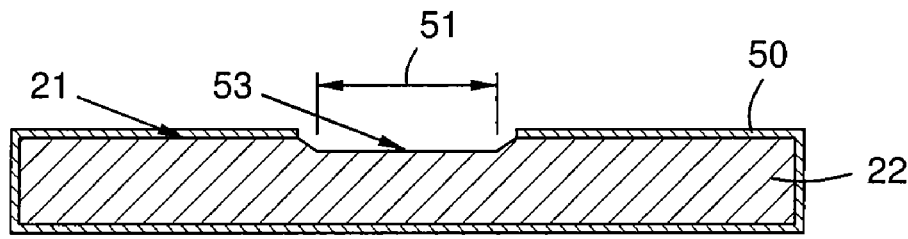
FIGS. 10-18 illustrate exemplary steps in fabricating a via having geometry according to the invention using KOH etching.

FIGS. 10-18 illustrate an exemplary via fabrication process as follows:

FIG. 10: Deposit a mask material 50 such as silicon nitride ($Si_3N_4$) on a silicon substrate 22, using low pressure chemical deposition (LPCVD) for example. Pattern the mask on the first surface 21 of the substrate and expose the via etching area 53. KOH-etch the substrate to the depth of the interlock minimum 51.

Figure 11:
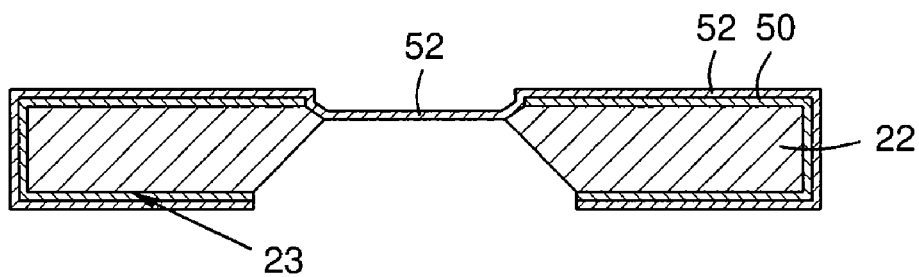

FIG. 11: Deposit a second mask layer 52 on the substrate to protect the exposed substrate surface 53 of FIG. 10A. Pattern the mask on the second surface 23 of the substrate and expose the via etching area. KOH-etch the second surface of the substrate through to the second mask layer 52. Silicon crystal planes may provide automatic trapezoidal geometry during KOH etching of the substrate. For example, silicon type 110 wafers have crystal planes that will produce a trapezoidal trench with two oblique faces and two normal faces relative to the substrate surfaces 21, 23.

Figure 12:
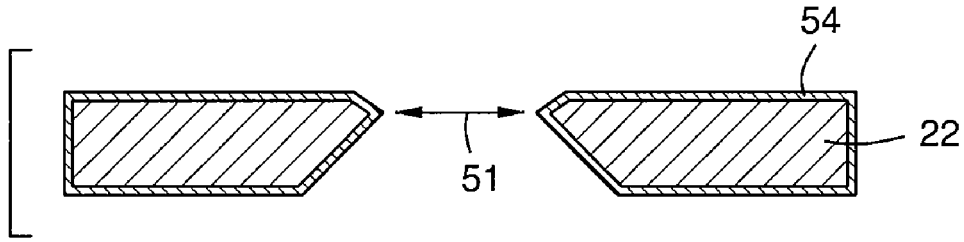

FIG. 12: Apply or grow a layer of silicone dioxide 54 on the substrate to electrically isolate the via and provide a stop layer for chemical mechanical polishing (CMP).

Figure 13:
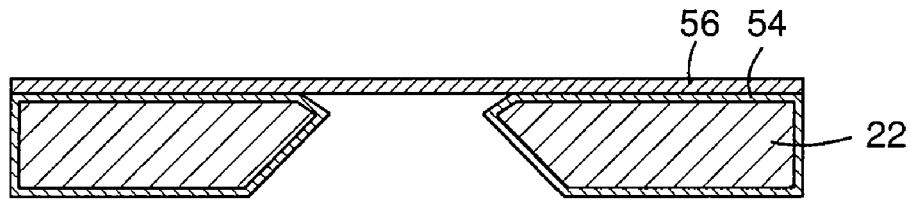

FIG. 13: Apply a dry film resist laminate 56 over the first surface of the substrate.

Figure 14:
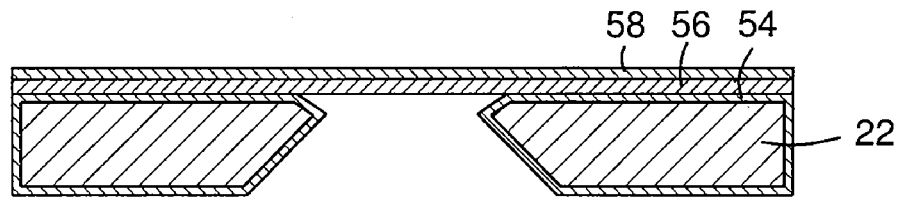

FIG. 14: Sputter a copper seed layer 58 on the film resist laminate as an electroplating base for the via core conductor.

Figure 15:
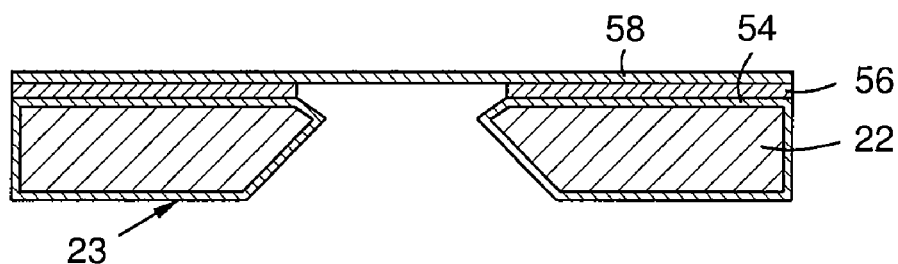

FIG. 15: Etch the resist laminate 56 from the second surface 23 of the substrate down to the copper layer 58 with a technique such as plasma or reactive ion etching.

Figure 16:
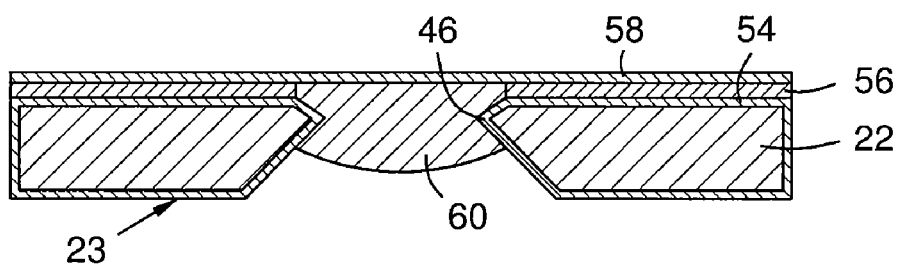

FIG. 16: Electroplate a copper core conductor 60 onto the copper seed layer 58 to fill the via volume at least past the interlock 46.

Figure 17:
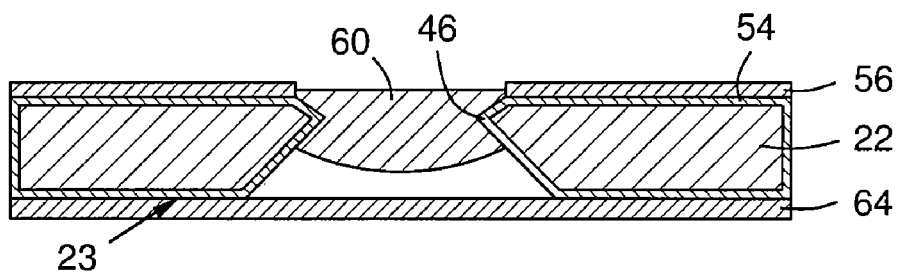
Figure 18:
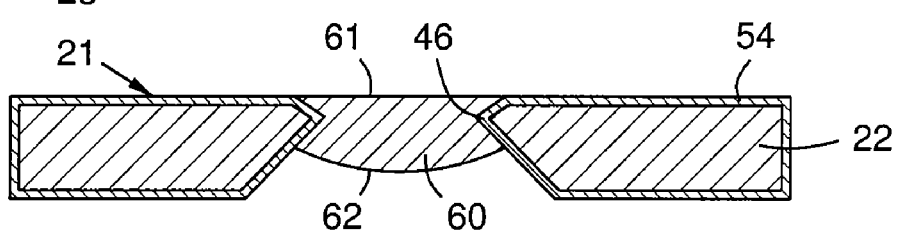

FIG. 17: Apply a protective layer or membrane 64 to the back surface 23 of the substrate FIG. 18: Abrade the resist laminate 56 and the copper core 60 flush with the silicon dioxide layer 54 on the first surface 21 of the substrate with a method such as CMP. The interlock 46 prevents the copper core 60 from being pushed out of the via during abrasion.

The substrate is now ready for application of a bus on the first surface 21 over the first end 61 of the via core 60, then heating the core to solder it to the bus, and later soldering the second end 62 of the via core to a lead or circuit board.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. Microelectromechanical system (MEMS) circuitry including an electrical connection through a substrate, said circuitry comprising:
    a substrate comprising first and second mutually opposite surfaces separated by a distance;
    an electrical bus disposed on the first surface of the substrate; and
    a via arranged to pass through the substrate from the bus to the second surface of the substrate;
    wherein the via is at least partly filled with an electrically conductive material, and the via is configured to define an interlock positioned closer to the first surface of the substrate than to the second surface to reduce thermally-induced expansion of the electrically conductive material towards the surface where the electrical bus is disposed, thereby avoiding damage to the bus.

2. The MEMS circuitry of claim 1 wherein the interlock is positioned within 40% of the distance from the first surface to the second surface of the substrate.

3. The MEMS circuitry of claim 2, wherein the interlock comprises a constriction of the via.

4. The MEMS circuitry of claim 2, wherein the interlock comprises an enlargement of the via.

5. The MEMS circuitry of claim 1, wherein said circuitry comprises MEMS switching circuitry, wherein the bus anchors, actuates, or contacts a plurality of microswitch beams along a length of the bus, and the via comprises a longitudinal dimension substantially aligned with the length of the bus and a width dimension substantially aligned with a width of the bus.

6. The MEMS circuitry of claim 5 wherein the longitudinal dimension of the via is greater than a unit spacing of the beams along the length of the bus.

7. The MEMS circuitry of claim 6, wherein the width dimension of the via is less than the longitudinal dimension of the via.

8. The MEMS circuitry of claim 5, wherein the longitudinal dimension of the via is approximately equal to the length of the bus, and the width dimension of the via is approximately equal to the width of the bus.

9. The MEMS circuitry of claim 1, wherein the via has a generally prismatic trapezoidal geometry comprising first and second opposed faces substantially normal to the first surface of the substrate, and comprising third and fourth faces substantially normal to the first and second faces of the via and oblique to the first surface of the substrate.

10. The MEMS circuitry of claim 9, wherein the bus has a length and a width, the trapezoidal via comprises a correspondingly aligned length and width, and the trapezoidal via is greater in length at the second surface of the substrate than at the first surface of the substrate.

11. Microelectromechanical system (MEMS) switching circuitry including an electrical connection through a substrate, said switching circuitry comprising:
    a substrate comprising a thickness and first and second mutually opposite surfaces;
    an electrical bus mounted on the first surface of the substrate; and
    a via arranged to pass through the substrate from the bus to the second surface of the substrate, the via comprising a trench through the substrate at least partly filled with an electrical conductor;
    wherein the bus anchors, contacts, or actuates a plurality of microswitch beams in unison along a length of the bus, and the via comprises a longitudinal dimension substantially aligned with the length of the bus.

12. The switching circuitry of claim 11 wherein the longitudinal dimension of the via is greater than a unit spacing of the microswitch beams along the length of the bus.

13. The switching circuitry of claim 11, wherein an interlock is positioned to reduce thermally-induced expansion of the electrically conductive material with respect to at least one of the surfaces.

14. The switching circuitry of claim 13 wherein the interlock is positioned within a distance of 40% of the thickness of the substrate from the first surface of the substrate.

15. The switching circuitry of claim 11 wherein the via has a generally prismatic trapezoidal geometry comprising first and second opposed faces substantially normal to the first surface of the substrate, and comprising third and fourth faces substantially normal to the first and second faces of the via and oblique to the first surface of the substrate.

16. The switching circuitry of claim 15, wherein the bus has a width, and the trapezoidal via is greater in length at the second surface of the substrate than at the first surface of the substrate.

17. Microelectromechanical system (MEMS) switching circuitry including an electrical connection through a substrate, said switching circuitry comprising:
an electrical bus mounted on a first surface of the substrate; and
a via passing through the substrate from the bus to a second surface of the substrate, the via comprising a trench through the substrate at least partly filled with an electrical conductor, the trench and the conductor therein formed with a geometry that blocks the conductor from expanding toward the bus;
wherein the bus anchors, actuates, or contacts a plurality of microswitch beams along a length of the bus, and the via comprises a longitudinal dimension substantially aligned with the length of the bus, the longitudinal dimension of the via being greater than a unit spacing of the beams along the length of the bus.

18. An electrical connection through a substrate comprising:
a substrate comprising a first surface and a second surface opposed to the first surface; and
a via passing through the substrate from the first surface to the second surface, and configured with an interlock positioned closer to one of the first and second surfaces of the substrate where an electrical bus is disposed such that an electrical conductor disposed within the via is constrained from extruding towards said one of the surfaces where the bus is disposed.

19. The electrical connection of claim 18, further comprising a MEMS device mounted on the first surface of the substrate and electrically connected to the via.

\* \* \* \* \*